(12) United States Patent
Barrow

(10) Patent No.: US 6,498,390 B1
(45) Date of Patent: *Dec. 24, 2002

(54) INTEGRATED CIRCUIT PACKAGE THAT INCLUDES A THERMALLY CONDUCTIVE TAPE WHICH ATTACHES A THERMAL ELEMENT TO A PLASTIC HOUSING

(75) Inventor: Michael Barrow, El Dorado Hills, CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 157 days.

(21) Appl. No.: 09/154,258

(22) Filed: Sep. 16, 1998

(51) Int. Cl.[7] .............................. H01L 23/495
(52) U.S. Cl. .................. 257/675; 257/706; 257/717
(58) Field of Search ............... 257/706, 675, 257/717; 438/119, 122

(56) References Cited

U.S. PATENT DOCUMENTS

| | | | | | |
|---|---|---|---|---|---|
| 4,876,588 A | * | 10/1989 | Miyamoto | .................. | 257/706 |
| 5,533,256 A | * | 7/1996 | Call et al. | .................... | 438/122 |
| 5,641,946 A | * | 6/1997 | Shim | .......................... | 257/738 |
| 5,672,548 A | * | 9/1997 | Culnane et al. | ............. | 257/706 |
| 5,738,936 A | * | 4/1998 | Hanrahan | ................... | 257/706 |
| 5,875,102 A | * | 2/1999 | Barrow | ....................... | 257/692 |
| 5,917,700 A | * | 6/1999 | Clemens et al. | ............ | 257/727 |

FOREIGN PATENT DOCUMENTS

| | | | |
|---|---|---|---|
| JP | 07-193162 | * | 7/1995 |
| JP | 10-135276 | * | 5/1998 |

* cited by examiner

*Primary Examiner*—Phat X. Cao
(74) *Attorney, Agent, or Firm*—Blakely, Sokoloff, Taylor & Zafman LLP

(57) ABSTRACT

An integrated circuit package which may have a thermally conductive tape that attaches a thermal element to a package housing. The housing encloses an integrated circuit that is mounted to a substrate. The thermally conductive tape may be configured to conform with any warpage in the package and prevent the creation of air void in the housing/thermal element interface.

14 Claims, 1 Drawing Sheet

INTEGRATED CIRCUIT PACKAGE THAT INCLUDES A THERMALLY CONDUCTIVE TAPE WHICH ATTACHES A THERMAL ELEMENT TO A PLASTIC HOUSING

BACKGROUND OF THE INVENTION

1. Field of the Invention

The present invention relates to an integrated circuit package.

2. Background Information

Integrated circuits are typically assembled into a package that is mounted to a printed circuit board. There are many types of integrated circuit packages including quad flat pack, pin grid array and plastic ball grid array (PBGA) packages. A PBGA package typically contains an integrated circuit which is mounted to a substrate. A plurality of solder balls are attached to a bottom surface of the substrate and reflowed to mount the package to a printed circuit board. The printed circuit board may be a motherboard of a computer system. The substrate may have routing traces and vias which connect the integrated circuit to the solder balls.

The integrated circuit of a PBGA package is enclosed by a protective plastic material. The outer plastic material is typically formed with an injection mold process. The integrated circuit generates heat which must be removed from the package. It may be desirable to attach a thermal element such as a heat sink to the plastic housing to facilitate the removal of heat generated by the integrated circuit. The thermal element may be bonded to the top surface of the package.

It has been found that the injection mold process may cause the package to warp. The warpage will create a lack of flatness in the top surface of the plastic housing. The lack of flatness may create air voids between the plastic housing and a thermal element that is mounted to the package. Air has a relatively low coefficient of thermal conductivity. Therefore any air voids in the package/thermal element interface will increase the thermal impedance from the integrated circuit to the thermal element. The increase in thermal impedance will raise the junction temperatures of the integrated circuit. It is important to maintain the junction temperatures below a threshold design value. It would be desirable to provide a means for attaching a thermal element to a plastic ball grid array package that can compensate for warpage in the plastic housing of the package.

SUMMARY OF THE INVENTION

One embodiment of the present invention is an integrated circuit package which may have a thermally conductive tape that attaches a thermal element to a package housing. The housing encloses an integrated circuit that is mounted to a substrate.

DETAILED DESCRIPTION OF THE INVENTION

One embodiment of the present invention is an integrated circuit package which may have a thermally conductive tape that attaches a thermal element to a package housing. The housing encloses an integrated circuit that is mounted to a substrate. The thermally conductive tape may be configured to conform with any warpage in the package and prevent the creation of air void in the housing/thermal element interface.

Figure 1:
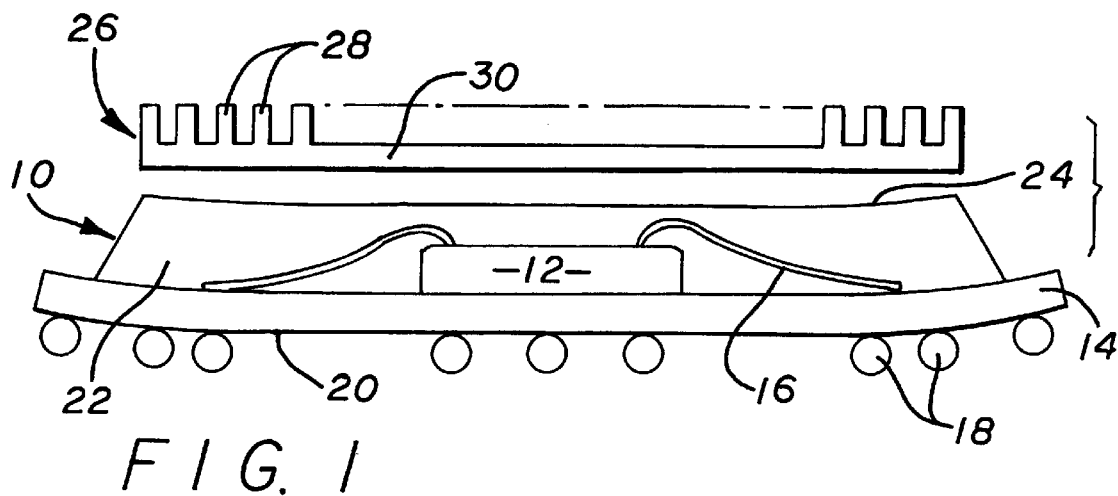
FIG. 1 is a side exploded view of an embodiment of an integrated circuit package of the present invention.

Referring to the drawings more particularly by reference numbers, FIG. 1 shows an embodiment of an integrated circuit package 10 of the present invention. The package 10 may include an integrated circuit 12 that is mounted to a substrate 14. The integrated circuit 12 may be electrically connected to the substrate 14 by a plurality of bond wires 16. Although bond wires 16 are shown and described, it is to be understood that the integrated circuit 12 may be connected to the substrate 14 by other means such as solder bumps utilized in a process commonly referred to as controlled collapsed chip connection (C4).

The package 10 may include a plurality of solder balls 18 that are attached to a bottom surface 20 of the substrate 14. The solder balls 18 may be reflowed to attach the package 10 to a printed circuit board (not shown). The substrate 14 may contain routing traces, surface pads, power/ground planes and vias, etc. which electrically connect the solder balls 18 with the bond wires 16. Although solder balls 18 are shown and described, it is to be understood that the package 10 may have other contacts such as pins.

The integrated circuit 12 may be enclosed by a housing 22 that is attached to the substrate 14. The housing 22 may be constructed from a plastic injection mold material. The injection mold process may cause a warpage in the package 10 so that there is curvature in the top surface 24 of the housing 22. The warpage may be caused by the differential thermal contraction of the plastic housing 22 and the substrate 14 when the package 10 cools down during the injection process. It has been found that the warpage usually creates a concave curvature in the top surface 24.

The integrated circuit 12 generates heat which must be removed from the package 10. A thermal element 26 may be attached to the housing 22 to facilitate the removal of heat from the integrated circuit 12. The thermal element 26 may be a heat sink which has a plurality of fins 28 that extend from a pedestal 30. The fins 28 increase the effective thermal area of the heat sink and improve the heat transfer rate of the package 10.

Figure 2:
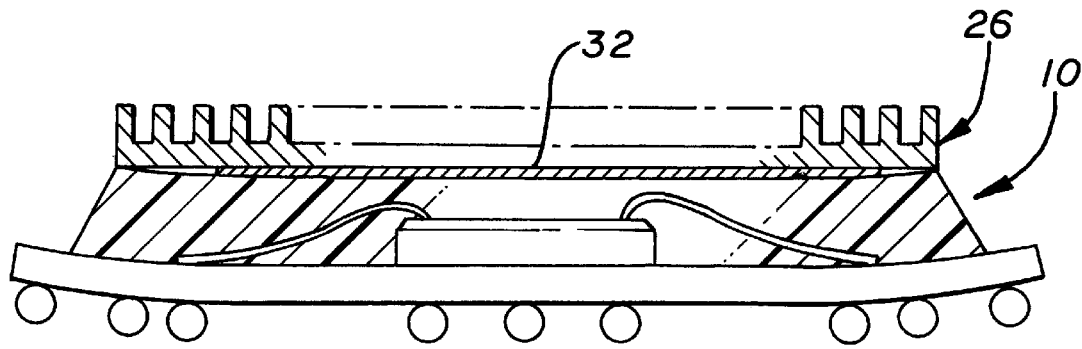
FIG. 2 is a side view showing a thermally conductive tape which attaches a thermal element to the package.

As shown in FIG. 2, the thermal element 26 can be attached to the housing 22 with a thermally conductive tape 32. Both sides of the thermally conductive tape 32 may have an adhesive material so that the tape 32 can be pressed onto both the housing 22 and the thermal element 26. The conductive tape 32 may be constructed from a material(s) that is thermally conductive to provide a thermally conductive interface between the housing 22 and the thermal element 26. The tape 32 may be cut to conform with the curvature in the top surface 24 of the housing 22 and to minimize the air voids between the thermal element 26 and the warped housing 22.

Figures 3, 4:
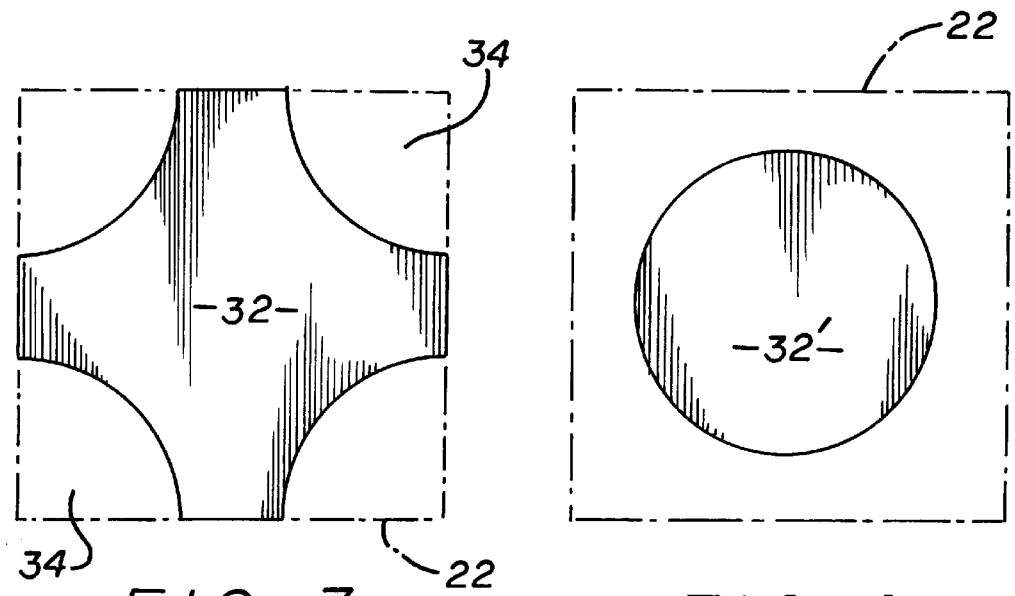
FIG. 3 is a top view of a pattern for a thermally conductive tape.
FIG. 4 is a top view of an alternate pattern for the thermally conductive tape.

FIG. 3 shows a pattern for the thermally conductive tape 32. The pattern may be such that the tape 32 does not extend into the corners 34 of the housing 22. FIG. 4 shows an alternate embodiment of a tape 32' which has a circular pattern that fills the center portion of the housing 22. Although two specific tape patterns are shown and described, it is to be understood that the tape 32 can be cut into any pattern that will fill in the warped housing 22 and create a planar surface for the thermal element 26. The tape 32 or 32' is typically cut into a desired pattern before being assembled into the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:
   a substrate;
   an integrated circuit mounted to said substrate;
   a housing to enclose said integrated circuit, said housing including a warped top surface;
   a thermally conductive tape attached to said top surface of said housing, the thermally conductive tape is patterned to convert a portion of the warped surface into a planar top surface; and,
   a thermal element attached to said portion of said thermally conductive tape.

2. The integrated circuit package as recited in claim 1, wherein said housing includes said top surface with an area, and said thermally conductive tape has an area that is less than said area of said top surface.

3. The integrated circuit package as recited in claim 2, wherein said top surface has four corners and said thermally conductive tape does not extend into said corners of said top surface.

4. The integrated circuit package as recited in claim 3, wherein said thermally conductive tape is shaped as a circle.

5. The integrated circuit package as recited in claim 1, wherein said thermal element is a heat sink.

6. The package as recited in claim 1, further comprising a solder ball that is attached to said substrate.

7. The package as recited in claim 1, wherein said housing is a plastic injection molded material.

8. An integrated circuit package, comprising:
   a substrate;
   a solder ball that is attached to said substrate;
   an integrated circuit mounted to said substrate;
   a plastic injection molded housing that encloses said integrated circuit, said plastic injection molded housing having a warped top surface with an area, said warped top surface having a concave curvature formed by thermal differentials between said substrate and said plastic injection molded housing during an injection mold process;
   a thermally conductive tape attached to said top surface of said plastic injection molded housing, said thermally conductive tape having an area that is less than said area of said top surface and patterned to transform a portion of said top surface into a planar surface; and,
   a thermal element attached to said portion of said thermally conductive tape.

9. The integrated circuit package as recited in claim 8, wherein said top surface has four corners said thermally conductive tape does not extend into said corners of said top surface.

10. The integrated circuit package as recited in claim 9, wherein said thermally conductive tape is shaped as a circle.

11. The integrated circuit package as recited in claim 8, wherein said thermal element is a heat sink.

12. Placed on a substrate, an integrated circuit package comprising:
    an integrated circuit;
    a housing directly attached to said substrate for completely enclosing said integrated circuit by said housing and said substrate, said housing includes a warped top surface having a concave curvature formed by a differential thermal contraction of said housing and substrate;
    a thermal conductive tape attached to a portion of the top surface of said housing that is smaller in area than said top surface, said thermal conductive tape being patterned to transform said portion of the top surface to a planar surface; and
    a thermal element attached to said thermal conductive tape.

13. The integrated circuit package of claim 12, wherein the thermal conductive tape is attached to the top surface of the housing.

14. The integrated circuit package of claim 12, wherein said thermal conductive tape is shaped in a circle.

* * * * *